United States Patent
Horie (10) Patent No.: US 7,784,660 B2
(45) Date of Patent: Aug. 31, 2010

(54) TAPE FEEDER (75) Inventor: Atsuyuki Horie, Fukuoka (JP)

(73) Assignee: Panasonic Corporation, Osaka (JP)

( * ) Notice: Subject to any disclaimer, the term of this patent is extended or adjusted under 35 U.S.C. 154(b) by 407 days.

(21) Appl. No.: 11/915,446

(22) PCT Filed: Jul. 13, 2006

(86) PCT No.: PCT/JP2006/314309

§ 371 (c)(1),
(2), (4) Date: Nov. 26, 2007

(87) PCT Pub. No.: WO2007/007912

PCT Pub. Date: Jan. 18, 2007

(65) Prior Publication Data

US 2009/0071996 A1    Mar. 19, 2009

(30) Foreign Application Priority Data

Jul. 13, 2005    (JP)    ............................... 2005-204173

(51) Int. Cl.
*B65H 20/00*    (2006.01)
*B65H 23/18*    (2006.01)

(52) U.S. Cl. ..................... 226/128; 226/29; 226/129; 29/740

(58) Field of Classification Search ............. 226/29, 226/32, 128, 129; 29/740, 762
See application file for complete search history.

(56) References Cited

U.S. PATENT DOCUMENTS

| 5,233,745 | A | * | 8/1993 | Morita | ........................ | 29/705 |
| 6,032,845 | A | * | 3/2000 | Piccone et al. | .............. | 226/139 |
| 6,082,428 | A | * | 7/2000 | Ando et al. | ................ | 156/584 |
| 7,131,478 | B2 | * | 11/2006 | Endo et al. | ................... | 156/584 |
| 7,299,540 | B2 | * | 11/2007 | Shimada | ...................... | 29/743 |
| 7,562,440 | B2 | * | 7/2009 | Ito et al. | ....................... | 29/739 |
| 2002/0184755 | A1 | * | 12/2002 | Suhara | ........................ | 29/833 |
| 2006/0011645 | A1 | * | 1/2006 | Shimada | ..................... | 221/121 |

FOREIGN PATENT DOCUMENTS

| EP | 0 876 091 | 11/1998 |
| JP | 10-163684 | 6/1998 |
| JP | 11-307992 | 11/1999 |
| JP | 2000022386 A | 1/2000 |

(Continued)

OTHER PUBLICATIONS

International Search Report Dated Oct. 9, 2006.

*Primary Examiner*—Evan H Langdon
(74) *Attorney, Agent, or Firm*—Pearne & Gordon LLP (57) ABSTRACT

In a tape feeder to feed electronic parts with a carrier tape, a lower support member 23 with magnet supporting the carrier tape from its lower side and stabilizing positions of the electronic parts contained in part pockets on the carrier tape by a magnetic force is constituted by a horizontal base 24 mounted on the frame member, an elongated leaf spring member 25 having an upward convex shape in a middle part thereof so as to be supported by the base 24 at opposite ends thereof, and a magnet member 26 attached on an upper face of the middle part of the leaf spring member 25. A fitting hole 24*b* to which the magnet member 26 can be fitted is formed in the base 24.

7 Claims, 8 Drawing Sheets

| | FOREIGN PATENT DOCUMENTS | | | JP | 2004-111726 | * | 8/2004 |
|---|---|---|---|---|---|---|---|
| JP | 2001-168582 | * | 6/2001 | JP | 2005175045 A | | 6/2005 |
| JP | 2001168582 A | | 6/2001 | | | | |
| JP | 2004-111726 | | 4/2004 | * cited by examiner | | | |

TAPE FEEDER

BACKGROUND ART

This invention relates to a tape feeder which is provided into an electronic part mounting apparatus and which feeds electronic parts held by the tape to a pick-up position for a mount head.

There is known generally a tape feeder for feeding electronic parts held by a carrier tape that is used as a feeding device of the electronic parts in an electronic part mounting apparatus. In such a tape feeder, accompanying with downsizing of the electronic parts such as semiconductor chips, troubles can be easily caused due to unstabilized positions of the electronic parts that are caused by impact or static electricity during tape feeding. In other words, as the electronic parts contained in pockets are brought into exposed state by peeling a top tape covering upper faces of the electronic parts before reaching the pick-up position, impacts are posed on the electronic parts when stopping and moving in tape feeding operation. Accordingly, the electronic parts in the pockets behave unstably, so that operational troubles such as pick-up error can be easily caused. At this time, if the carrier tape is electrostatically charged, the positions of the electronic parts can be further unstable.

To improve the above situation, there has been proposed conventionally a tape feeder which deals with stabilization of the electronic parts at the pick-up position (see, for example, Japanese Patent Publication No. H11-307992A). In this publication, a magnet is disposed on a lower support member to the carrier tape provided in a traveling path of the carrier tape in a tape feeder main body. By this construction, magnetic force by the magnet is affected to the electronic parts from the lower face of the carrier tape, so that an effect to prevent deterioration of the positions of the electronic parts is obtained.

However, there have been the following disadvantages in such the conventional tape feeder.

That is, since carrier tapes used in the same tape feeder have different widths and different sectional shape according to their types, it is necessary to replace the lower support member on which the magnet is disposed when the carrier tape is changed. Therefore, there are problems that equipment cost and management cost are increased by reserving a variety of lower support members, and that it takes time and labor for equipment replacement operation for the change of the carrier tape type.

The present invention has been made in view of the above circumstances, and an object of the invention is to provide a tape feeder in which the lower support member can be commonly employed and is superior in versatility, so that the equipment replacement operation for the change of the tape can be simplified.

DISCLOSURE OF THE INVENTION

The above object has been achieved by a tape feeder of the present invention which pitch-feeds a carrier tape holding electronic parts thereby to feed the electronic parts to a pick-up position for a mount head, comprising:

a frame member having a tape traveling path on which the carrier tape travels;

a tape feed mechanism pitch-feeding the carrier tape along the tape traveling path;

an upper guide part covering and guiding the carrier tape in a vicinity of the pick-up position; and a lower support member disposed below the upper guide part to support a lower side of the carrier tape and to stabilize positions of the electronic parts contained in recesses of the tape carrier;

wherein the lower support member includes a magnet member displaceable in vertical direction according to a thickness of the tape carrier.

According to the invention, the lower support member, which is provided in order to support the carrier tape from the lower side thereof as well as to stabilize the positions of the electronic parts by the magnetic force, can be commonly employed for plural types of carrier tapes having different thickness, by configuring the magnet member to be displaceable in vertical direction according to the thickness of the tape carrier.

BEST MODE FOR CARRYING OUT THE INVENTION

Figure 1:
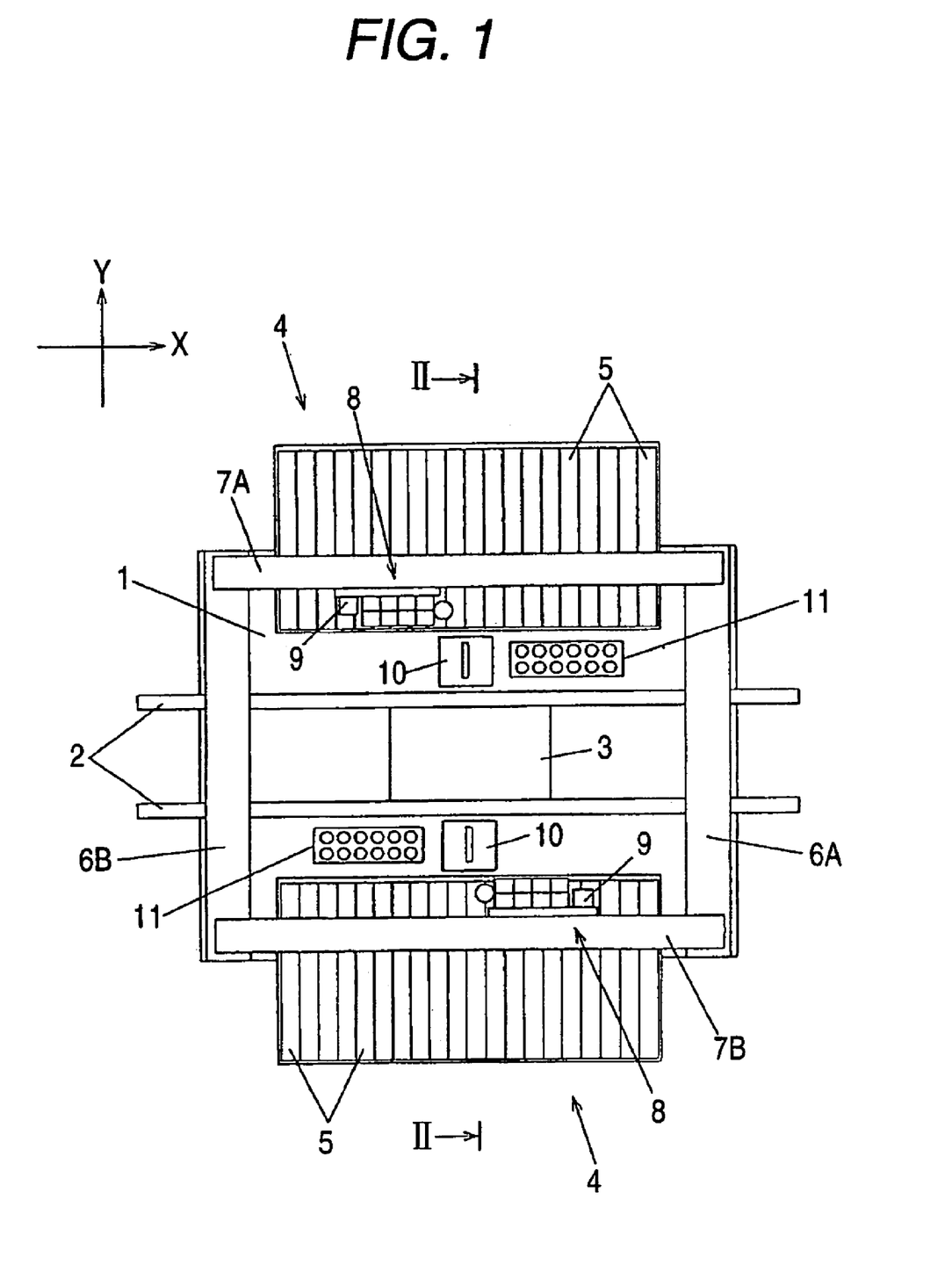
FIG. 1 is a plan view showing an electronic part mounting apparatus according to one preferred embodiment of the invention.
Figure 2:
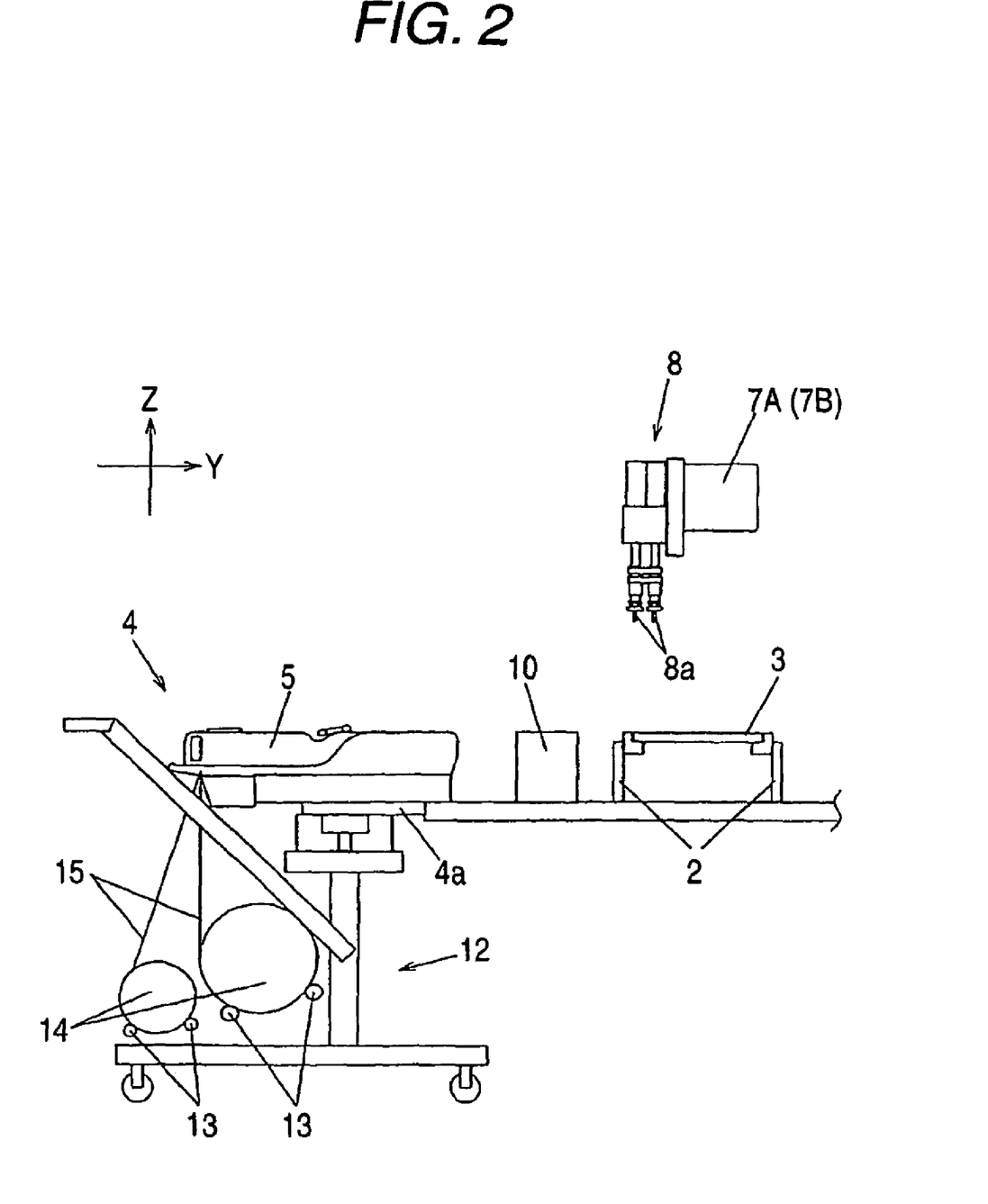
FIG. 2 is a partial sectional view of the electronic part mounting apparatus according to the embodiment of the invention.
Figure 3:
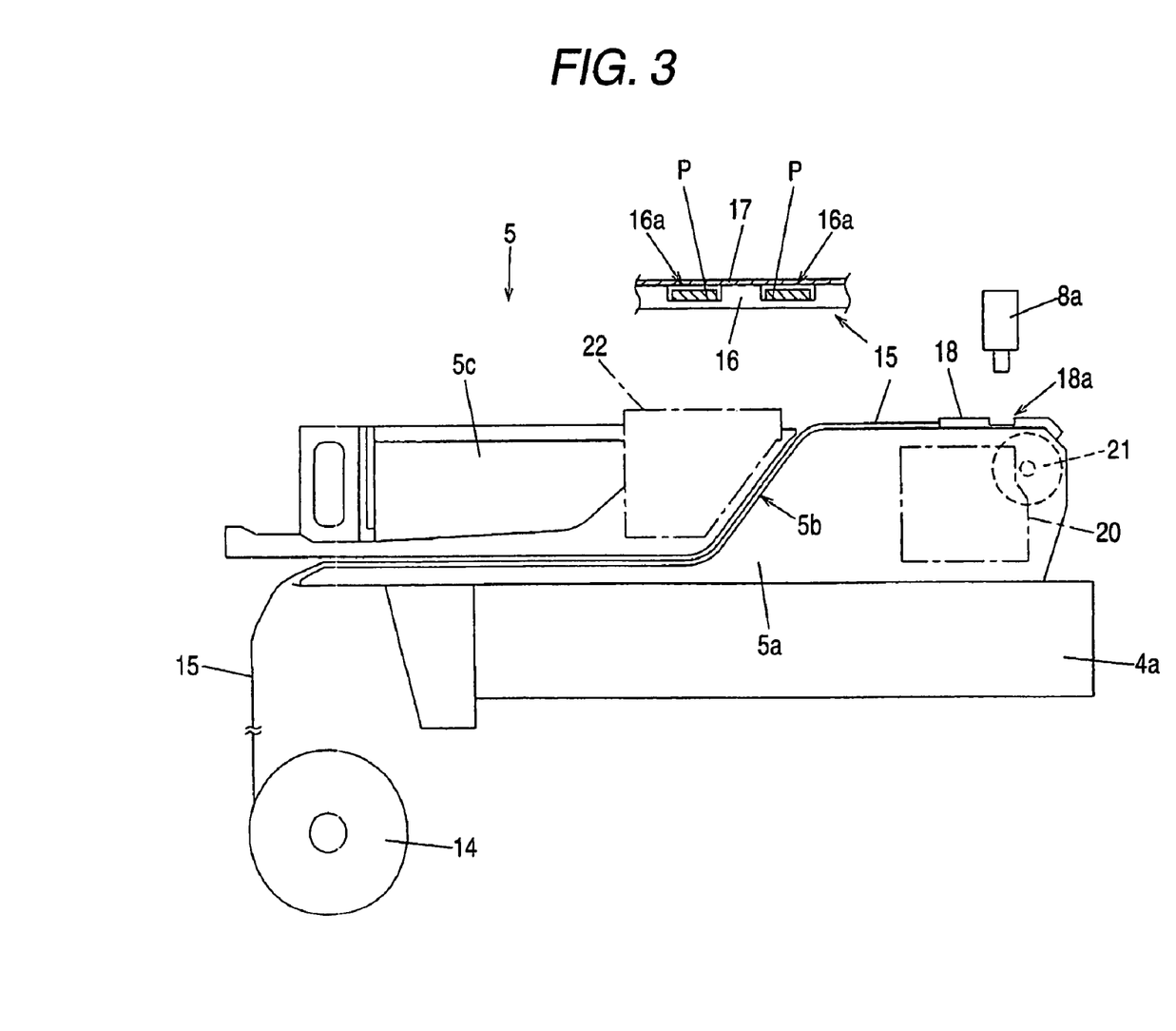
FIG. 3 is an explanatory figure showing a structure of the tape feeder according to the embodiment of the invention.
Figure 4:
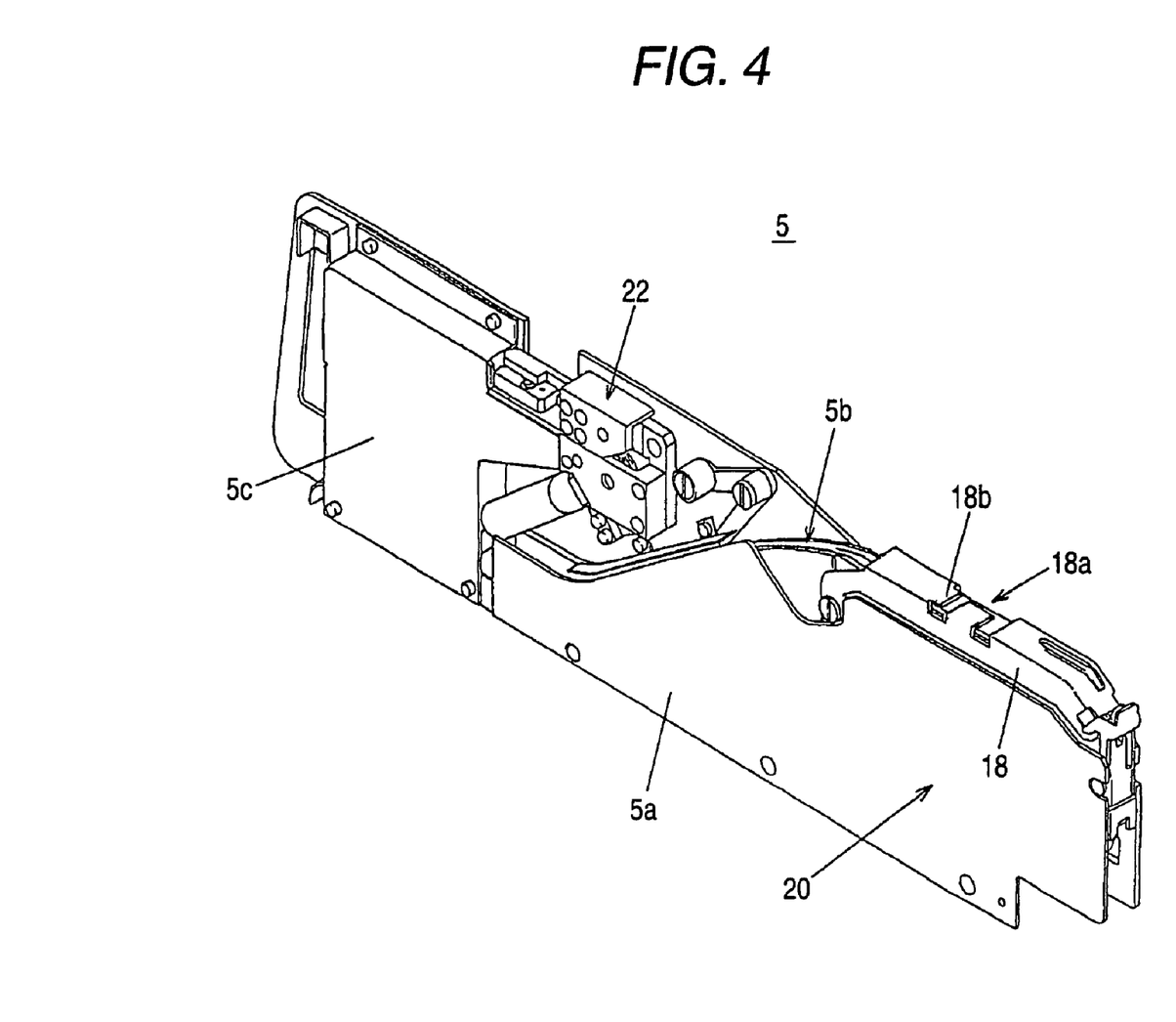
FIG. 4 is a perspective view of the tape feeder according to the embodiment of the invention.
Figure 5A:
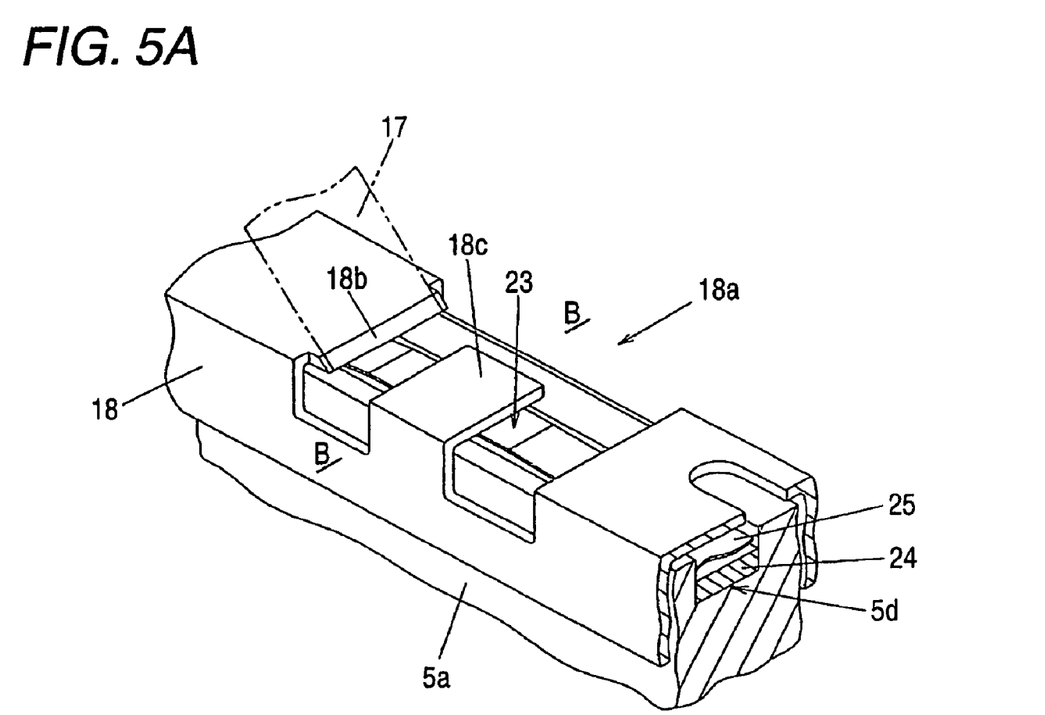
FIG. 5A is a partial perspective view of the tape feeder according to the embodiment of the invention.
Figure 5B:
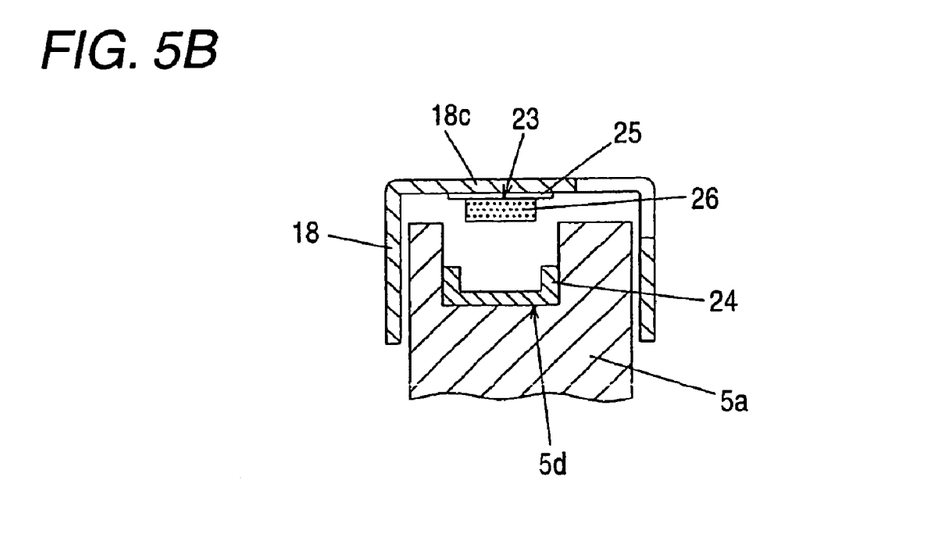
FIG. 5B is partial sectional view of the tape feeder according to the embodiment of the invention.
Figure 6A:
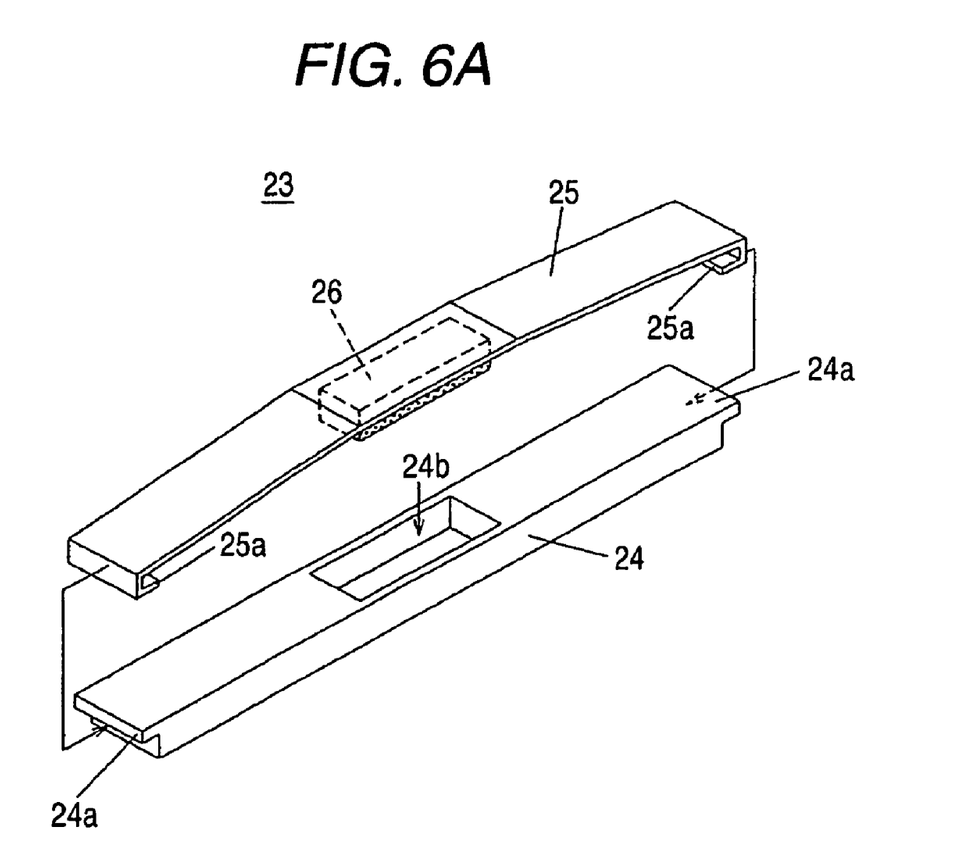
FIGS. 6A and 6B are explanatory figures showing a structure of a lower support member with magnet provided in the tape feeder according to the embodiment of the invention.
Figure 6B:
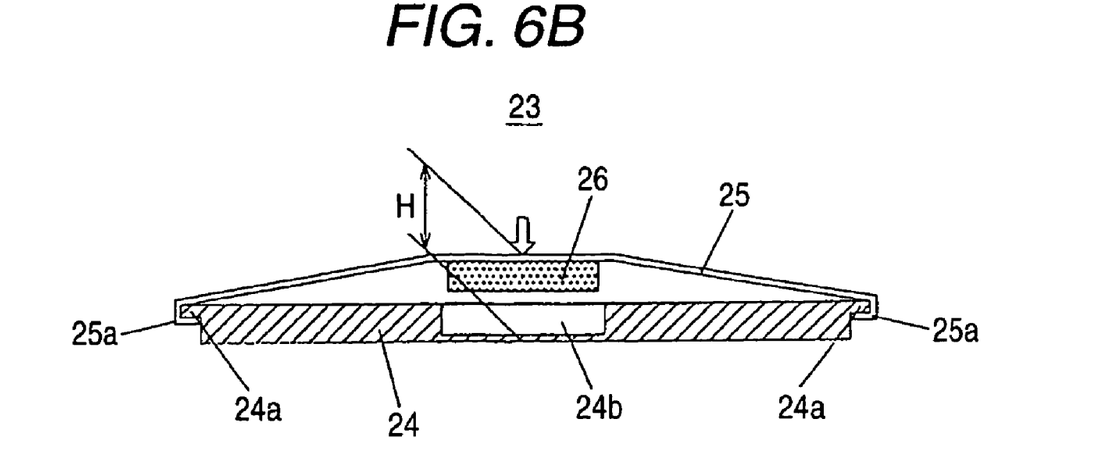

A preferred embodiment of the present invention will now be described in detail with reference to the drawings. FIG. 1 is a plan view showing an electronic part mounting apparatus according to one preferred embodiment of the invention; FIG. 2 is a partial sectional view of the electronic part mounting apparatus according to the embodiment of the invention; FIG. 3 is an explanatory figure showing a structure of the tape feeder according to the embodiment of the invention; FIG. 4 is a perspective view of the tape feeder according to the embodiment of the invention; FIG. 5A is a partial perspective view of the tape feeder according to the embodiment of the invention; FIG. 5B is a partial sectional view of the tape feeder according to the embodiment of the invention; FIG. 6 is an explanatory figure showing a structure of a lower support member with magnet provided in the tape feeder according to the embodiment of the invention; and FIGS. 7A, 7B, 8A and 8B are explanatory figures showing a function of the lower guide member with magnet provided in the tape feeder according to the embodiment of the invention.

Referring to FIGS. 1 and 2, the structure of the electronic part mounting apparatus will be described below. FIG. 2 shows partially a section taken along the line II-II in FIG. 1. As shown in FIG. 1, a conveyor track 2 extending along X direction (substrate conveying direction) is disposed in a center of a base table 1. The conveyor track 2 conveys a substrate 3 supplied from the upstream side of the conveyer track 2 and positions the substrate 3 on a mounting stage. Part feeding portions 4 are disposed on both sides of the conveyor track 2. Plural tape feeders 5 are juxtaposed in each feeding portion 4. Each tape feeder 5 feeds electronic parts to a pick-up position for a mount head 8 described later by pitch-feeding a carrier tape holding the electronic parts.

Y-axis tables 6A, 6B are disposed on opposite sides of an upper face of the base table 1. Two X-axis tables 7A, 7B are disposed on the Y-axis tables 6A, 6B so to bridge therebetween. By actuating the Y-axis table 6A, the X-axis table 7A is horizontally moved along Y direction. By actuating the Y-axis table 6B, the X-axis table 7B is also horizontally moved along Y direction. The mount head 8 and a substrate recognition camera 9 integrally movable with the mount head 8 are provided each of the X-axis tables 7A, 7B.

By driving the Y-axis table 6A and the X-axis table 7A in combination, and by driving the Y-axis table 6B and the X-axis table 7B in combination, the mount heads 8 are horizontally moved respectively to pick up electronic parts from the part feeding portions 4 through suction nozzles 8a (See FIG. 2), as well as to mount the parts on the substrate 3 positioned in the conveyor track 2. The substrate recognition camera 9 moved above the substrate 3 images the substrate 3 for recognition. Further, a part recognition camera 10 and a nozzle holding portion 11 are disposed in a passage from each part feeding portion 4 to the conveyor track 2.

When one of the mount heads 8 that has picked up an electronic part from the corresponding feeding portion 4 is moved to the substrate 3 positioned in the mount stage, the part recognition camera 10 images the electronic part held with the suction nozzles 8a by moving the electronic part along X direction above the part recognition camera 10. Not only the position of the electronic part but also the type of the electronic part is recognized in a state that the electronic part is held with the suction nozzle 8a by processing the imaging result by a recognition processor (not-shown). Each nozzle holding portion 11 houses plural types of the suction nozzles 8a in predetermined positions. The mount head 8 accesses to the nozzle holding portion 11 to conduct nozzle changing operation. Thus, the nozzle is changed in accordance with the type of the electronic part that is to be mounted by the mount head 8.

Next, the structure of the part feeding portion 4 will be described. As shown in FIG. 2, a feeder base 4a is provided for mounting the tape feeders 5 in the part feeding portions 4. The tape feeders 5 are mounted on the part feeding portion 4 by a truck 12 for mounting to the tape feeders. The truck 12 is provided with reel holders 13 for holding tape reels 14 in which carrier tapes 15 are housed in a wound state, respectively. Each reel holder 13 is provided with a holding roller which rotationally holds the tape reel 14. The carrier tape 15 can be extracted by rotating the tape reel 14 disposed in the part feeding portion 4.

Next, referring to FIGS. 3 and 4, functions of the tape feeder 5 will be described. As shown in FIGS. 3 and 4, a tape traveling path 5b on which the carrier tape 15 travels is formed in a frame member 5a mounted on the feeder base 4a. The carrier tape 15 extracted from the tape reel 14 is transported toward the downstream side (right side in FIG. 3) along the upper face of the tape traveling path 5b. Electronic parts P are held in part pockets 16a formed on the carrier tape 15 at a constant pitch and the upper faces of the part pockets 16a are covered with a top tape 17.

A sprocket 21, which has feeding pins for engaging with tape feeding holes (not-shown) formed on the carrier tape 15 at a constant pitch, is disposed on the upper side of the frame member 5a and on the downstream part of the frame member 5b. The sprocket 21 is rotated intermittently by a rotation drive mechanism 20 having a motor, so that the carrier tape 15 is pitch-fed along the tape traveling path 5b. The sprocket 21 and the rotation drive mechanism 20 constitutes a tape feeding mechanism for pitch-feeding the carrier tape along the tape traveling path 5b.

In front of the sprocket 21, the pick-up position is located at which one of the electronic parts P held in the part pockets 16a as recesses for containing the electronic parts is picked up with the suction nozzle 8a of the mount head 8. An upper guide part 18 is disposed on the upper face of the frame member 5a in the downstream part of the frame member 5b, covering over the carrier tape 15 for guiding in a vicinity of the pick-up position. A suction opening 18a is formed on the upper guide part 18. A top tape peeling portion 18b is formed for peeling off the top tape 17 at the downstream edge of the suction opening 18a. Namely, the top tape 17 is peeled off and pulled back toward the upstream side by the top tape peeling portion 18b in a middle of the course in which the carrier tape 15 travels below the upper guide part 18. The top tape 17 pulled backward is wound to be stored in a tape storage portion 5c by a top tape feeding mechanism 22.

Figure 8A:
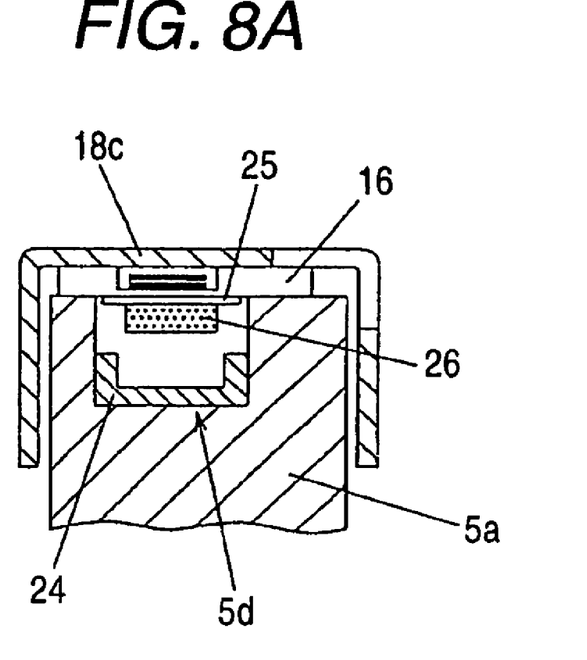

Next, referring to FIGS. 5A and 5B, the structures of the tape feeding path around the pick-up position for the mount head 8 and the suction opening 18a will be described. FIG. 5B shows the section taken along the line VB-VB in FIG. 5A. In FIGS. 5A and 5B, illustration of the sprocket 21 for feeding the tape and the carrier tape 15 is omitted. On the upper face of the frame member 5a, there is formed a groove 5d extending along the tape feeding direction. Top portions of opposite side walls of the groove portion 5d constitute a lower support face supporting a base tape 16 from the lower side (see FIG. 8). The base tape 16 is pitch-fed while being guided both on the upper and lower faces by this lower support face and the upper guide part 18, respectively. At this time, if the carrier tape to be fed is an embossed tape which has emboss portions projecting downward, the tape feeding is performed such that the emboss portions are moved along inside of the groove portion 5d.

Figure 7A:
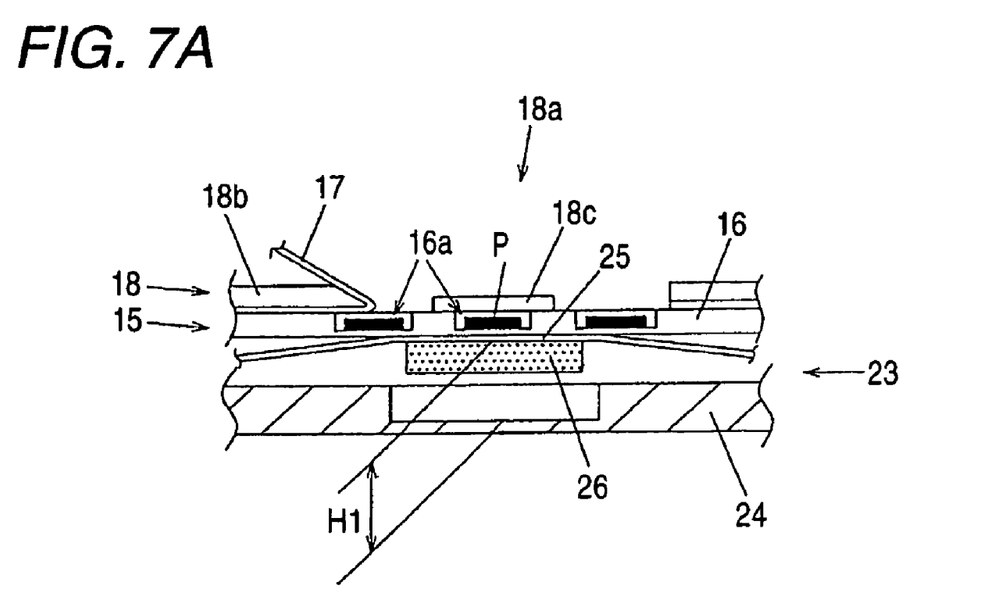
FIGS. 7A, 7B, 8A and 8B are explanatory figures showing a function of the lower guide member with magnet provided in the tape feeder according to the embodiment of the invention.

As shown in FIG. 5A, the suction opening 18a formed on the upper guide part 18 includes an intermediate cover portion 18c which extends from the right side on the tape feeding path at an intermediate position, so that the suction opening 18a is divided into two of front and rear opening parts along the feeding direction by the intermediate cover portion 18c. The rear opening part of the intermediate cover portion 18c is the opening for turning back the top tape 17 peeled off at the top tape peeling portion 18b. The front opening part of the intermediate cover portion 18c is the opening for picking up the electronic part P in the part pockets 16a with the suction nozzles 8a. The intermediate cover portion 18c has a function of covering the upper part of the base tape 16, so that electronic part P would not bolt out of the part pocket 16a that is exposed by peeling off the top tape 17 due to vibrations or impacts during tape feeding (see FIG. 7).

Inside of the groove portion 5d, as shown in FIG. 5B, in a position below the upper guide part 18, a lower support member 23 with magnet is disposed so as to be configured with two members vertically stacked, consisting of a base 24 and a leaf spring member 25 on which a magnet member 26 is mounted. The lower support member 23 with magnet supports the carrier tape 15 from the lower side and has a function of stabilizing the position of the electronic part contained in the part pocket 16a by a magnetic force by the magnet member 26.

As shown in FIG. 6, the base 24 is made of a thin rectangular metal strip and is horizontally mounted in the groove portion 5*d* by a fixing device such as bolts. Incidentally, if the base 24 is fabricated from a resin having high flexibility, the base 24 can be fixed using elasticity of the resin itself without using bolt or the like by press-fitting positioning pins projected on the frame member 5*a* into fitting holes formed on the base 24. At both ends of the base 24, there are provided retaining portions 24*a* to retain the leaf spring member 25, and at the center portion, there is provided a fitting hole 24*b* to which the magnet member 26 can be fitted.

The leaf spring member 25 is provided by processing a nonmagnetic spring material such as copper alloys into substantially the same length as the base 24. Needless to say, spring materials other than nonmagnetic materials can be employed. In the leaf spring member 25, bent portions are provided at two positions across the center position along the longitudinal direction so that opposite ends of the leaf spring member 25 go downward to some extent and the center portion is shaped to protrude upward. At both end portions of the leaf spring member 25, folding portions 25*a* for retaining to the retaining portions 24*a* of the base 24 are formed by bending formation. On the lower face of the center portion of the leaf spring member 25, the magnet member 26 is fixed with a certain method such as bonding with adhesive.

FIG. 6B shows a section where one lower support member 23 with magnet is constituted by retaining the folding portions 25*a* to the retaining portions 24*a*. The leaf spring member 25 is mounted to the base 24 so as to be supported at opposite ends with a basic height H above the base 24. In this state, by applying load from the upper side to the center portion of the leaf spring member 25, the leaf spring member 25 is subjected to bending deformation, the magnet member 26 mounted to the leaf spring member 25 is displaced downward with respect to the base 24. Here, just below the magnet member 26, since the fitting hole 24*b* is formed into a shape such that the magnet member 26 is insertable, the magnet member 26 is allowed to be displaced downward until a lower limit height at which the lower face of the magnet member 26 contacts with a bottom face of the fitting hole 24*b*.

Figure 7B:
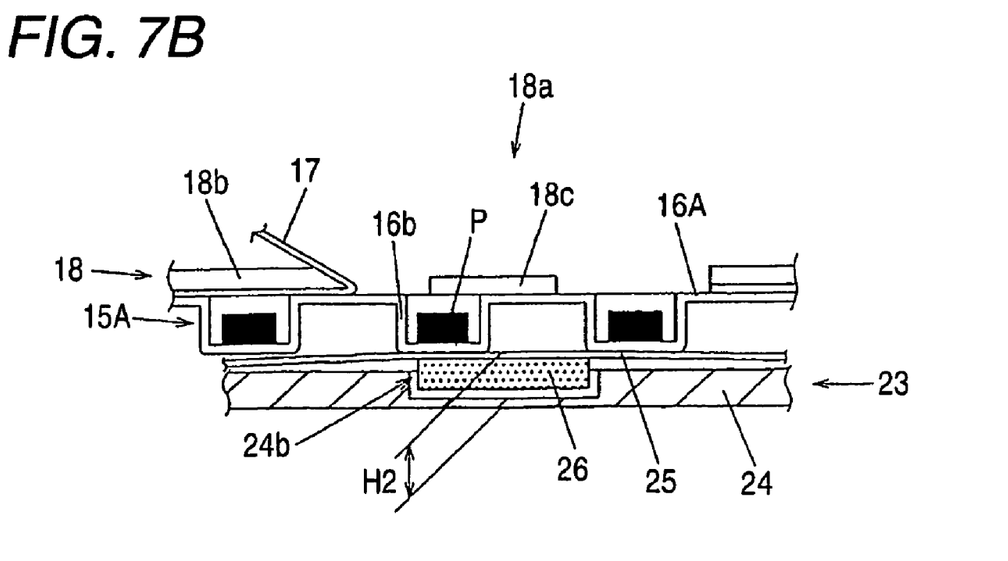
Figure 8B:
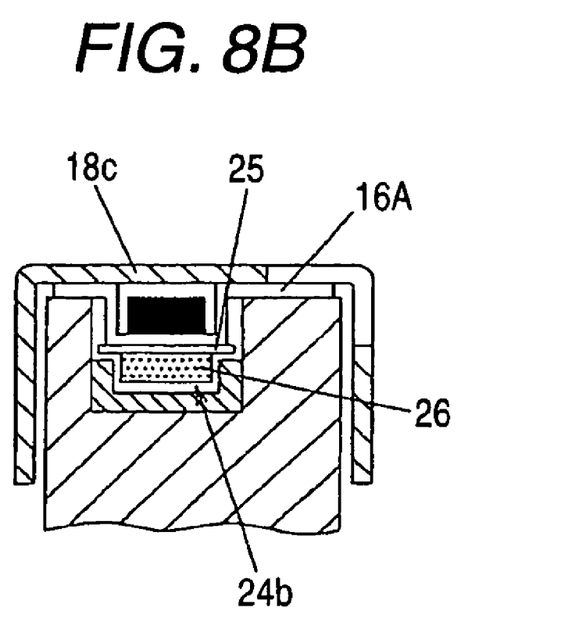

Next, referring to FIGS. 7A through 8B, the guiding state on the lower side of the carrier tape in the suction opening 18*a* as well as functions of the lower support member 23 with magnet will be described. FIGS. 7A and 7B show a guiding state that the upper face of the carrier tape led into the tape feeder 5 is guided by reaching the upper guide part 18 while the lower face of the carrier tape is supported by the lower support member 23 with magnet. FIGS. 7A and 7B show side views in the vicinity of the suction opening 18*a*, respectively in a case that a paper carrier tape 15 is fed and in a case that a carrier tape 15A on which an emboss processing is performed is fed. Further, FIGS. 8A and 8B show sectional views in a direction perpendicular to the tape feeding direction corresponding to FIGS. 7A and 7B, respectively.

As shown in FIG. 7A, the carrier tape 15 from which the top tape 17 has been peeled at the top tape peeling portion 18*b*, namely, only the base tape 16, is pitch-fed in a state that the upper face thereof is partially covered with the intermediate cover portion 18*c*. At this time, as shown in FIG. 8A, the base tape 16 passes over the upper face of the leaf spring member 25 protruding upward between the upper face of the frame member 5*a* and the lower face of the upper guide part 18.

At this time, a reaction force directing upward by the leaf spring member 25, which is generated against the deformation to press down the leaf spring member 25 until the lower support height H1 in accordance with the thickness of the base tape 16, is subjected to the base tape 16, so that the base tape 16 is pitch-fed along the lower faces of the top tape peeling portion 18*b* and the intermediate cover portion 18*c*. When the part pocket 16*a* containing the electronic part P passes above the magnet member 26 mounted to the lower face of the leaf spring member 25, the magnetic force is subjected to the electronic part P, so that the position of the electronic part P is stabilized during the tape feeding. Here, since the leaf spring member 25 is made of a nonmagnetic material, it does not disturb the effect of the magnet member 26.

As shown in FIG. 7B, the carrier tape 15A from which the top tape 17 has been peeled at the top tape peeling portion 18*b*, namely, only a base tape 16A on a lower face of which emboss portions 16*b* are provided, is pitch-fed similarly to the tape carrier 15 so as to pass between the upper face of the frame member 5*a* and the lower face of the upper guide part 18. At this time, the emboss portion 16*b* receives a reaction force directing upward by the leaf spring member 25, which is generated against the deformation to press down the leaf spring member 25 until the lower support height H2 in accordance with the thickness of the emboss portion 16*b*, the base tape 16A is pitch-fed in such the condition along the lower faces of the top tape peeling portion 18*b* and the intermediate cover portion 18*c*.

When the emboss portion 16*b* which contains the electronic part P passes above the magnet member 26 mounted to the lower face of the leaf spring member 25, the magnetic force is subjected to the electronic part P, so that the position of the electronic part P is stabilized during the tape feeding. Here, since the fitting hole 24*b* into which the magnet member 26 is insertable is formed in the base 24, a margin to press down the leaf spring member 25 can be sufficiently provided, even when mounting the base tape 16A having emboss portions 16*b* the thickness of which is much larger than that of the paper base tape 16.

The lower support member 23 with magnet does not need to be limited to be mounted below the suction opening 18*a* and the peeling area of the top tape 17 as described in the above embodiment, and may be mounted over an area broader than it has to be for stabilizing the position of the electronic part P. Further, in the above embodiment, since conductive materials are employed both for the leaf spring member 25 being in contact with the carrier tape and the base 24 retaining to the leaf spring member 25, the leaf spring member 25 is configured so as to be electrically connected with the frame member 5*a*. By this construction, removal of electricity charged in the carrier tape can be assuredly performed through the leaf spring member 25 and the base 24, so that the troubles due to the electrification can be reduced.

Using lower support members with magnets, there have been following problems in the conventional tape feeders. That is, conventionally, according to the type of the carrier tape to be fed, namely, according to whether the carrier tape to be fed is a paper carrier tape or an embossed carrier tape, and according to the difference in the emboss heights, a particular lower support member should be selectively used among those having different lower support height of the embossed carrier tape. In particular, when the embossed carrier tape is fed, it has been desirable to maintain a clearance between the bottom face of the emboss portions and the lower support member in order to prevent generation of vibrations due to tape feeding of the carrier tape. Accordingly, it has been necessary to reserve a variety of lower support members according to the emboss heights, and it has taken much time and labor for management of these parts.

In contrast, by using the lower support member 23 with magnet according to the above embodiment, in either cases of the paper tape or the embossed tape to be fed, and further, in a case that various types of the embossed tapes having different embossed heights are fed, it is sufficient to provide only one lower support member. Therefore, it is possible to accomplish the simplification in the equipment replacement operation corresponding to the change of the tape type, and running cost reduction and management of parts and equipments can be easily performed. Further, since the carrier tape is fed in a state that the carrier tape is in contact with the leaf spring member 25 all of the time, and the clearance between the magnet member 26 and the bottom face of the tape is kept constant all of the time, fluctuation in position stabilizing effect by the magnet on the electronic parts is reduced. Furthermore, since the flat and smooth leaf spring member 25 is employed as the lower support member, even if the electronic part P having a certain size falls down into the suction opening 18a for some reason, operational troubles such that the electronic part is locked between the tape and another member are hardly caused.

In the above embodiment, the example is shown that the magnet member 26 is mounted to the lower face of the leaf spring member 25, the magnet member 26 may be mounted to the upper face of the leaf spring member 25, and resin may be applied on the upper face of the magnet member 26 so as to be flat and smooth.

INDUSTRIAL APPLICABILITY

The tape feeder of the invention is advantageous in that the lower support member can be commonly employed and it is superior in versatility, so that the equipment replacement operation for the tape type change can be simplified, therefore the invention is applicable to electronic part mounting apparatus which mounts electronic parts into a substrate by picking up from the plural types of carrier tapes.

The invention claimed is:

1. A tape feeder which pitch-feeds a carrier tape holding electronic parts thereby to feed the electronic parts to a predetermined pick-up position, comprising:

a frame member having a tape traveling path on which the carrier tape travels;

a tape feed mechanism pitch-feeding the carrier tape along the tape traveling path;

an upper guide part covering and guiding the carrier tape in a vicinity of the pick-up position; and a lower support member disposed below the upper guide part to support a lower side of the carrier tape and to stabilize positions of the electronic parts contained in recesses of the tape carrier;

wherein the lower support member includes a magnet member displaceable in a vertical direction according to a thickness of the tape carrier, a horizontal base mounted on the frame member, and an elongated leaf spring member vertically opposed to the horizontal base, wherein the magnet member is attached on a lower face of the middle part of the leaf spring member.

2. A tape feeder according to claim 1, wherein the elongated leaf spring member has an upward convex shape in a middle part thereof so as to be supported by the base at opposite ends thereof.

3. A tape feeder according to claim 1, wherein the leaf spring member is provided with a nonmagnetic spring material.

4. A tape feeder according to claim 1, wherein the leaf spring member is electrically connected with the frame member.

5. A tape feeder according to claim 1, wherein the base is fixed on a groove formed on an upper face of the frame member.

6. A tape feeder according to claim 1, wherein a fitting hole to which the magnet member is insertable is formed in the base.

7. A tape feeder according to claim 6, wherein the magnet member is inserted into the fitting hole or taken out of the fitting hole in accordance with the thickness of the tape carrier.

* * * * *